United States Patent
Inagaki

(10) Patent No.: US 7,362,871 B2
(45) Date of Patent: Apr. 22, 2008

(54) AUDIO AMPLIFIER CIRCUIT AND AUDIO IC HAVING THE SAME

(75) Inventor: Ryosuke Inagaki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 882 days.

(21) Appl. No.: 10/835,061

(22) Filed: Apr. 30, 2004

(65) Prior Publication Data

US 2004/0223624 A1    Nov. 11, 2004

(30) Foreign Application Priority Data

May 7, 2003    (JP) .............................. 2003-128725

(51) Int. Cl.
*H03G 11/00*    (2006.01)

(52) U.S. Cl. .................. 381/55; 381/120; 381/121; 381/59; 330/298; 330/207 P

(58) Field of Classification Search ................ 381/120, 381/121, 59, 55, 58, 96; 330/287, 293, 298, 330/207 P; 327/309, 312, 314, 316, 320, 327/323

See application file for complete search history.

(56) References Cited

U.S. PATENT DOCUMENTS

| | | | | |
|---|---|---|---|---|
| 3,959,736 A | * | 5/1976 | GrosJean | 330/207 P |
| 4,301,330 A | * | 11/1981 | Trump | 381/55 |
| 4,495,640 A | * | 1/1985 | Frey | 381/61 |
| 5,939,938 A | * | 8/1999 | Kalb et al. | 330/51 |
| 7,092,533 B1 | * | 8/2006 | Hasegawa et al. | 381/94.5 |
| 7,206,419 B1 | * | 4/2007 | Poletti | 381/98 |

FOREIGN PATENT DOCUMENTS

JP    7-35449    8/1995

* cited by examiner

*Primary Examiner*—Vivian Chin
*Assistant Examiner*—Jason Kurr
(74) *Attorney, Agent, or Firm*—Mattingly, Stanger, Malur & Brundidge, PC

(57) ABSTRACT

In the present invention, in parallel with a resistor which determines an amplification rate being fed back from an output to an input of an output stage OP amp in an audio amplifier circuit, providing a first diodes connected bi-directionally together with a first switch circuit, the output voltage of the output stage OP amp is limited to a voltage, when the first diodes are turned ON. The limit voltage of the first diodes corresponds to a speaker having a low withstand voltage. Accordingly, through ON/OFF of the first switch circuit, a power output from the output stage OP amp can be selected depending on the withstand voltage of a speaker to be connected.

16 Claims, 2 Drawing Sheets

AUDIO AMPLIFIER CIRCUIT AND AUDIO IC HAVING THE SAME

BACKGROUND OF THE INVENYION

1. Field of the Invention

The present invention relates to an audio amplifier circuit and an audio IC having the same, and more specifically, relates to an audio amplifier circuit used in the fields such as a cellular phone, a portable terminal apparatus, a fixed phone and a note type personal computer, which is permitted to drive a speaker in accordance with the withstand voltage of a speaker to be connected or the maximum input power thereof and is suitable for a small size speaker.

2. Conventional Art

In the fields such as a cellular phone, a portable terminal apparatus, a fixed phone and a note type personal computer, since the circuit scale and the mounting space of an audio IC is limited, a small size speaker having a small output of about 0.5 W through 1 W is used. When a user drives these sorts of speaker for a long time with the maximum volume thereof, the voice coil of the speaker sometimes damages.

As a protection circuit for such speaker damage, conventionally, with regard to a high output amplifier, a circuit in which such as a fuse is provided in series between an output terminal and a speaker has been known. Further, as an over voltage protection circuit for such as a high output amplifier, a diode clump circuit provided in parallel with an output stage transistor is also known. Still further, JP (U)-B-7-35449 discloses an audio amplifier circuit provided with a diode limit circuit at an output stage.

Now, as a power amplifier for an audio amplifier circuit, one having a maximum output (an output power) of about 1.0 W is generally available as in a form of an IC, when using the same, a speaker to be connected having a maximum input watt more than 1.0 W is selected. For a speaker having a maximum input watt less than 1.0 W, respective output stage amplifier circuits have to be designed while matching with the withstand voltages or the maximum input powers of the respective speakers. Because, if not being matched, a possible damaging the speakers become high. However, a size of a power amplifier having a maximum output watt of about 1.0 W does not differ from one having about a few W as ICs and the mounting spaces thereof also substantially the same.

On one hand, in connection with such as a cellular phone, a portable terminal apparatus and a fixed phone, depending on the models thereof, either a small output or a large output is required. For this reason, several kinds of ICs for audio output amplifiers are required to be prepared depending on the audio output powers. When the production amount of the audio output amplifiers having a maximum output watt of about 1.0 W or less than that decreases, a problem arises to increase the cost of these ICs.

SUMMARY OF THE INVENTION

An object of the present invention is to resolve these problems in the conventional art and to provide an audio amplifier circuit and an audio IC having the same, which is permitted to drive a speaker in accordance with the withstand voltage of a speaker to be connected or the maximum input power thereof and is suitable for a small size speaker.

An audio amplifier circuit and an audio IC having the same of the present invention for achieving the object is structured to provide a first diode limit circuit constituted by a series circuit of first diodes provided bi-directionally and a first switch circuit, and an output stage operational amplifier (herein below, will be referred to as an output stage OP amp) including a feed back resistor feeding back an output to an input to which the first diode limit circuit is connected in parallel, wherein a limit voltage of the first diode limit circuit corresponds to a speaker having a low withstand voltage which is connected to an output terminal of the output stage OP amp and under the condition when the speaker is connected to the output stage OP amp, the first switch circuit is turned ON.

As will be seen from the above, in the present invention, in parallel with the resistor which determines an amplification rate being fed back from the output to the input of the output stage OP amp in the audio amplifier circuit, providing the first diodes connected bi-directionally together with the first switch circuit, the output voltage of the output stage OP amp is limited to a voltage when the first diodes are turned ON. The limit voltage of the first diodes corresponds to the speaker having a low withstand voltage. Accordingly, through ON/OFF of the first switch circuit, a power output from the output stage OP amp can be selected depending on the withstand voltage of a speaker to be connected.

Thereby, even if the output of the output stage OP amp in the audio amplifier circuit is a large power, a small size and low withstand voltage speaker can be connected thereto without damaging the speaker and the IC incorporating the output stage OP amp can be used in common for a speaker having a high withstand voltage and a speaker having a low withstand voltage or a low maximum input power.

As a result, even if the models in such as a cellular phone, a portable terminal apparatus and a fixed phone are different, a same IC for audio amplifier circuit can be used, the individual designs for the respective models are dispensed with and many common ICs can be produced, therefore, low cost ICs for audio amplifiers can be realized.

Further, since a speaker is a passive circuit having a predetermined impedance characteristic with respect to frequency, a large current flows depending on a high voltage, which forms a large input power. Since the input voltage to the speaker is in linear proportional to the input power, the term "withstand voltage" for a speaker is used as including "maximum input power" for a speaker throughout the specification and claims.

DETAILED DESCRIPTION OF THE EMBODIMENTS

Figure 1:
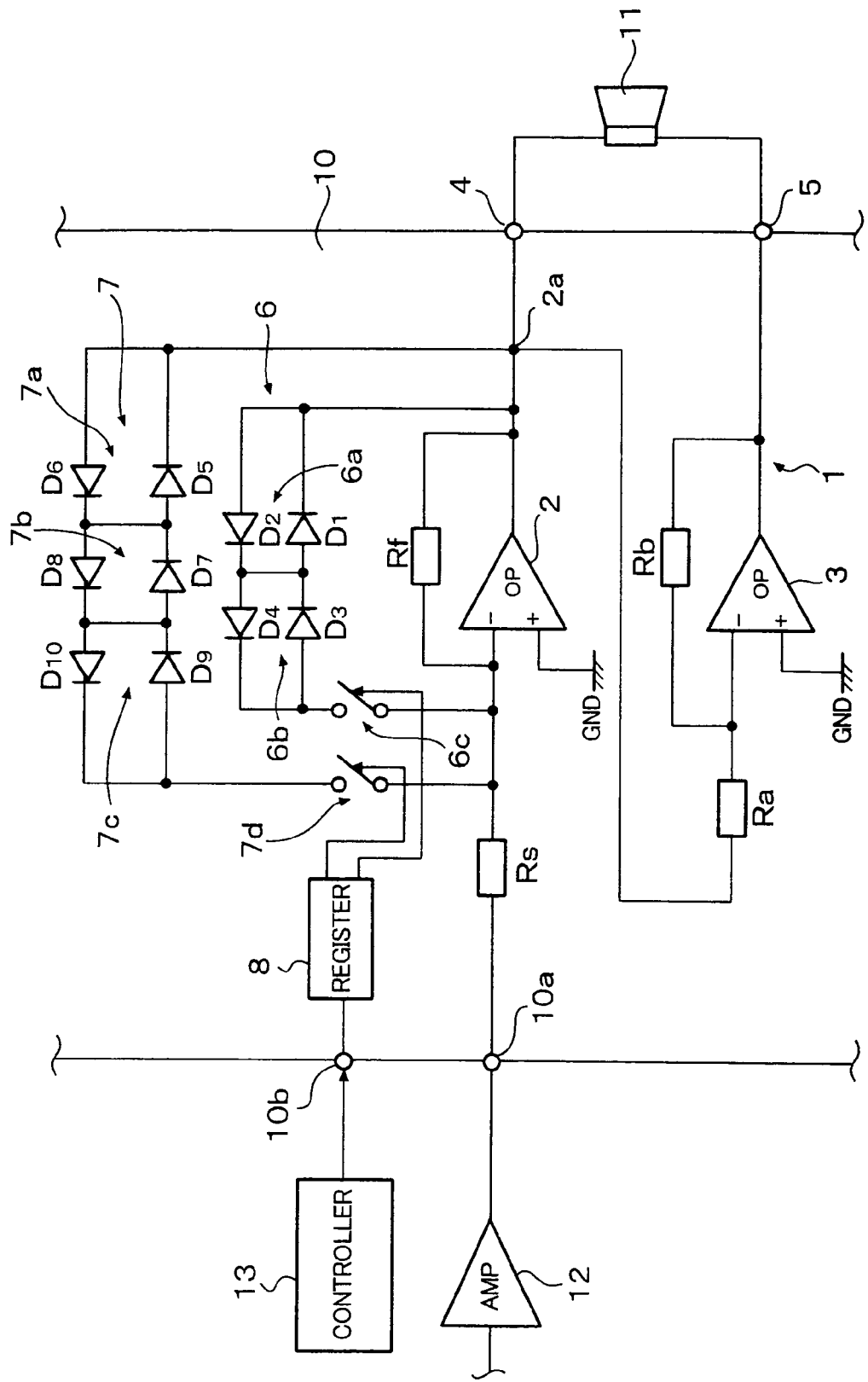
FIG. 1 is a block diagram of one embodiment of an audio amplifier circuit according to the present invention.

10 is an IC for an audio output amplifier and an amplifier in an audio apparatus having a small output power (output watt) of about 1.0 W for such as a cellular phone, a portable terminal apparatus, a fixed phone and a note type personal computer.

1 is the audio amplifier circuit. The audio amplifier circuit 1 includes output stage amps (OP) 2 and 3, which are formed in a form of IC and output terminals 4 and 5. Between the output terminals 4 and 5 a speaker 11 is connected.

Both output stage amps (OP) 2 and 3 are an inverting amplifier, and between a (−) input terminal and the output terminal of the output stage amp (OP) 2 diode limit circuits 6 and 7 are provided in parallel with a feed back resistor Rf for determining the amplification rate. The (−) input terminal of the output stage amp (OP) 2 is connected via an input resistor Rs to an input terminal 10a. A (−) input terminal of the output stage amp (OP) 3 is connected via an input resistor Ra to an output terminal 2a of the output stage amp (OP) 2. Respective (+) input terminals of the output stage amps (OP) 2 and 3 are respectively connected to the ground GND. To the input terminal 10a, an audio signal is input from a pre-amplifier 12.

Further, the pre-amplifier 12 can be integrated together with the audio amplifier circuit by incorporating into the IC 10. Further, a resistor Rb is a feed back resistor for the output stage amplifier (OP) 3 corresponding to the feed back resistor Rf.

Herein, the output stage amp (OP) 3 is an inverting amplifier, the phases of the output signals of the output stage amps (OP) 2 and 3 are opposite, thereby, the speaker 11 is BLT-driven by the output stage amps (OP) 2 and 3.

The diode limit circuit 6 is a feed back circuit in which a diode circuit 6a constituted by bi-directionally connected diodes D1 and D2, a diode circuit 6b constituted by bi-directionally connected diodes D3 and D4 and a switch circuit 6c are connected in series, and is provided in parallel with the feed back resistor Rf.

The diode limit circuit 7 is a feed back circuit in which a diode circuit 7a constituted by bi-directionally connected diodes D5 and D6, a diode circuit 7b constituted by bi-directionally connected diodes D7 and D8, a diode circuit 7c constituted by bi-directionally connected diodes D9 and D10 and a switch circuit 7d are connected in series, and is provided in parallel with the feed back resistor Rf.

8 is a 2 bit register and receives a 2 bit signal from a controller 13 (or a dip switch (not shown)) via an input terminal 10a. Thereby, the ON/OFF of the switch circuits 6c and 7d are set. For example, when 2 bit data is "00", both switch circuits 6c and 7d are turned OFF, when "01", the switch circuit 6c is turned ON and the switch circuit 7d is turned OFF and when "10", the switch circuit 6c is turned OFF and the switch circuit 7d is turned ON. Further, when the register 8 is constituted by a non-volatile memory or a dip switch, since 2 bit data are saved or put in a set state, even if the power source is turned OFF, the 2 bit data to be stored in the register 8 are enough if written once. However, when the register 8 is a volatile memory, for example, the 2 bit data are set to the register 8 by the controller 13 every time when the power source is turned ON.

Now, when assuming that the forward voltage drop of the respective diodes D1 through D10 is 1 Vf (≈0.7V), and when a signal of more than 2 Vf is output at the output, terminal 2a, the respective diodes D1 through D4 are turned ON and the diode limit circuit 6 limits the amplitude of the output signal to a voltage of 2 Vf (≈1.4). Further, when a signal more than 3 Vf is output at the output terminal 2a, the respective diodes D5 through D10 are turned ON, the diode limit circuit 7 limits the amplitude of the output signal to a voltage of 3 Vf (≈2.1 V). If the limit is not effected, the output voltage of the output stage amps (OP) 2 and 3 gives, for example, about 3 V, and when a speaker of 8 Ω is connected, the output assumes about 1.1 W, and when BTL driven, the output assumes about 2.2 W.

Herein, since the amplitude limited output signal is input to the output stage amp (OP) 3 in an inverting operation, only one output stage amp (OP) 2 is enough for the diode limit circuit 6.

When assuming that a speaker 11 of 8 Ω is connected to the IC 10, and the input power (input watt) depending on the withstand voltage is, for example, a low withstand voltage, in that the maximum input watt of the speaker 11 is about 0.5 W, 2 bit data of "01" are set in the register 8 to set the switch circuit 6c in ON state and the switch circuit 7d in OFF state. Thereby, the diode limit circuit 6 is operated and the voltage amplitude of the output of the output signal from the output stage amp (OP) 2 is limited to 2 Vf. As a result, the output stage amp (OP) 2 generates an output signal of about 1.4 V at the maximum. The peak to peak amplitude of the output signal at this instance is 2.8 Vpp, when the output stage amp is a single end output, and is 5.6 Vpp, double of the former, when BTL driven. Thus, the amplitude of the output signal, when BTL driven assumes 2.8 V and the effective value thereof assumes 2.0 (r.m.s.v.).

As a result, when calculating the output power Po (effective power) with respect to the speaker, Po=2×2/8=0.5, in that, when BTL driven the output power Po is 0.5 W. As a result, in this instance the output power with respect to the speaker 11 connected is about 0.5 W at the most through the BTL drive, thereby, the speaker is protected without damaging the coil thereof.

When the withstand voltage, in that the maximum input watt of the speaker 11 is about 1.0 W, 2 bit data of "10" are set in the register 8 to set the switch circuit 6c in OFF state and the switch circuit 7d in ON state. Thereby, since the output stage amp (OP) 2 generates an output signal of about 2.1 V at the maximum, the peak to peak amplitude of the output signal at this instance is 4.2 Vpp, when the output stage amp is a single end output, and is 8.4 Vpp, double of the former, when BTL driven. Thus, the amplitude of the output signal, when BTL driven assumes 4.2 V and the effective value thereof assumes 3.0 (r.m.s.v.).

As a result, when calculating the output power Po (effective power) with respect to the speaker, Po=3×3/8=1.1, in that, when BTL driven, the output power Po is 1.1 W. Thereby, the output power with respect to the speaker 11 connected is about 1.1 W at the most through the BTL drive, and the speaker is likely protected. Further, when the maximum input watt of the speaker 11 is 1.0 W, since there is an allowance of about 0.1 for the rating of the speaker 11, a speaker having a maximum input power of 1.0 W can be used.

Further, when the impedance of a speaker is 4 Ω the output power thereof doubles.

When providing a further diode limit circuit in parallel with the diode limit circuits 6 and 7 and increasing number of bi-directional diodes connected in series, output voltages for a variety of withstand voltages can of course be generated, even when the maximum input watt is more than 1 W.

Figure 2:
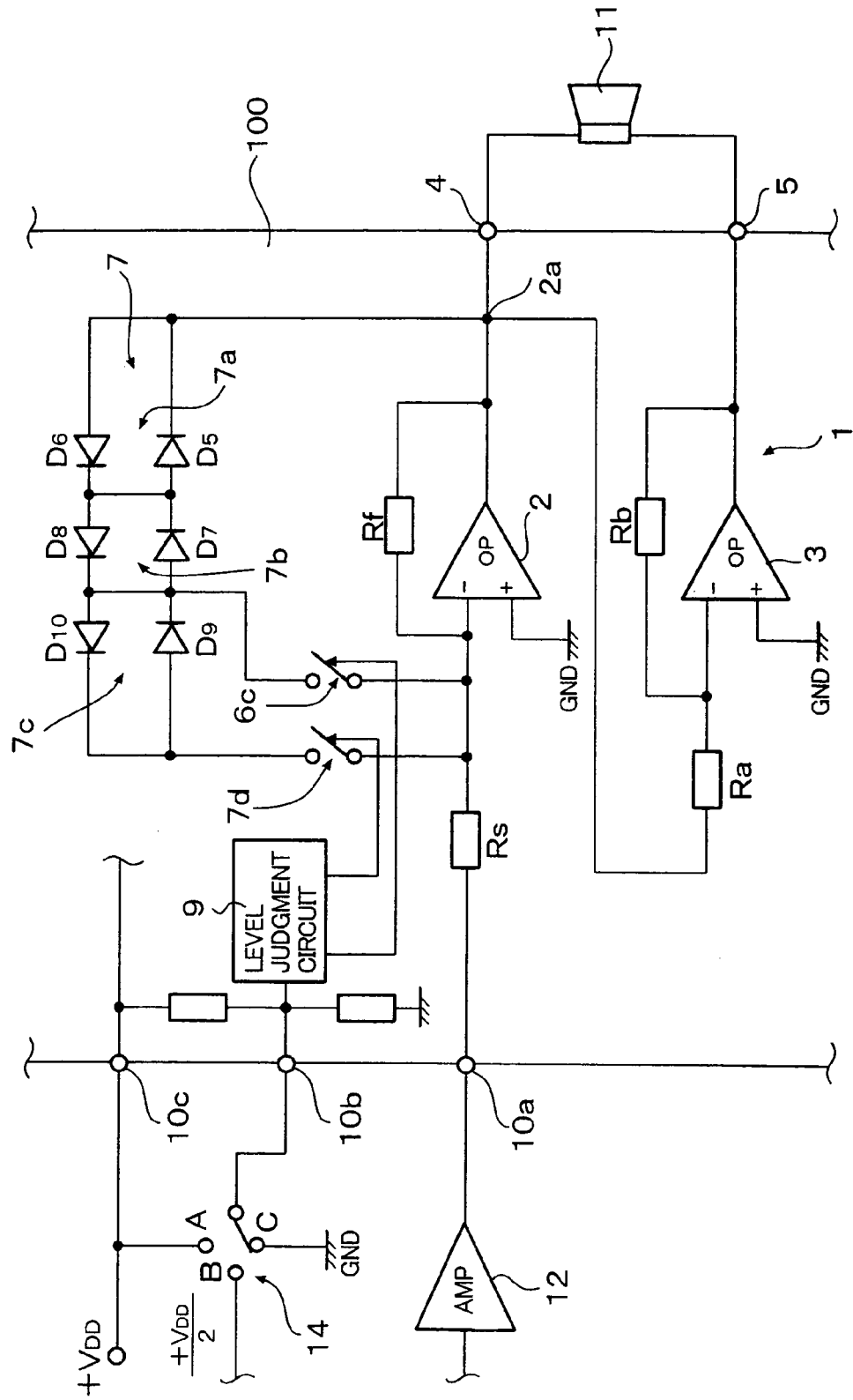
FIG. 2 is a block diagram of another embodiment according to the present invention.

FIG. 2 is an audio output IC 100 representing another embodiment of the resent invention, wherein a select switch 14 having three voltages externally is provided and a voltage selected by the select switch 14 is input via an input terminal 10b to a level judgment circuit 9. The level judgment circuit 9 generates a signal for turning ON/OFF switch circuits 6c and 7d in accordance with the voltage selected by the select switch 14.

In the diode limit circuit in FIG. 2, the diode limit circuit 6 is eliminated and only the diode limit circuit 7 remains. In the diode limit circuit 7, a connection point between the diode circuits 7b and 7c is connected via the switch circuit 6c to the (−) input terminal of the output stage amp (OP) 2.

When the select switch 14 selects a contact A, the power source line +VDD is selected and an output signal of a voltage +VDD is output, when a contact B is selected, voltage of +VDD/2 is selected and an output signal of a voltage +VDD/2 is output and when a contact C is selected, the potential of the ground GND is selected and an output signal of the ground potential is output.

Further, 10c is an input terminal of the power source line +VDD for power source voltage +VDD.

The level judgment circuit 9 includes two comparators provided respectively for the switch circuits 6c and 7d and when the output signal of the select switch 14 is at a voltage +VDD, the switch circuit 6c is turned ON and the switch circuit 7d is turned OFF in correspondence with "01" of the 2 bit data. Thereby, an audio amplifier circuit is selected which drives a speaker having a withstand voltage corresponding to 0.5 W at the maximum and the IC 10 constitutes an audio output amplifier of which output corresponds to the maximum input power of 0.5 W.

Further, when the output signal of the select switch 14 is at a voltage +VDD/2, the switch circuit 6c is turned OFF and the switch circuit 7d is turned ON in correspondence with "10" of the 2 bit data. Thereby, an audio amplifier circuit is selected which drives a speaker having a withstand voltage corresponding to 1.0 W at the maximum and the IC 10 constitutes an audio output amplifier of which output corresponds to the maximum input power of 1.0 W.

Further, when the output signal of the select switch 14 is at a potential of the ground GND, both switch circuits 6c and 7d are turned OFF in correspondence with "00" of the 2 bit data. Thereby, an audio amplifier circuit is selected which drives a speaker having a withstand voltage corresponding to about 2.2 W (about 2.0 W) at the maximum and the IC 10 constitutes an audio output amplifier of which output corresponds to the maximum input power of 2.0 W.

As has been explained hitherto, in the embodiments, the limit circuit of diodes is used, however, zener diodes can be of course used in place of the diodes. When the zener diodes are used, two diodes can be provided in series, thereby, these diodes can be turned ON bi-directionally.

Further, the diode can be a diode obtained by a diode connected transistor.

Still further, in the embodiments, as the diode limit circuit two kinds of circuits for 2Vf and 3Vf are provided, however, one kind or further many kinds of circuits can be provided.

In the embodiments, an example is shown in which the switch circuit in the diode limit circuit is connected to the input side of the output stage OP amp, however, the switch circuit can be connected to the output side of the output stage OP amp.

Further, the output stage OP amp 2 in the embodiments is an inverting amplifier, however, a non-inverting amplifier can be used in place thereof. Regardless to whether the output stage amplifier 2 is an amplifier of inverting operation or not, if the output stage amplifier 3 is an amplifier of inverting operation, the output signals of the output stage amplifiers 2 and 3 keep a relationship of inverting operation each other, thereby, the BTL drive can be effected. Of course the present invention is not limited to an audio amplifier circuit of BTL drive.

The invention claimed is:

1. An audio amplifier circuit comprising a first diode limit circuit constituted by a series circuit of first diodes provided bi-directionally and a first switch circuit, and an output stage operational amplifier including a feed back resistor feeding back an output to an input to which the first diode limit circuit is connected in parallel, wherein a limit voltage of the first diode limit circuit corresponds to a speaker having a low withstand voltage which is connected to an output terminal of the output stage operational amplifier, and wherein the first switch circuit is turned ON under the condition when the speaker is connected to the output stage operational amplifier.

2. The audio amplifier circuit according to claim 1, wherein the first diode limit circuit is two diodes connected in parallel in opposite directions each other or two zener diodes provided in series.

3. The audio amplifier circuit according to claim 2, further comprising a second diode limit circuit constituted by a series circuit of second diodes and a second switch circuit, wherein the second diode limit circuit is provided in parallel with the feed back resistor, a limit voltage of the second diode limit circuit is higher than the limit voltage of the first diode limit circuit and corresponds to a speaker having a higher withstand voltage than that of the low withstand voltage speaker, and wherein the first switch circuit is turned OFF and the second switch circuit is turned ON under the condition when the high withstand voltage speaker is connected to the output stage operational amplifier.

4. The audio amplifier circuit according to claim 3, wherein at least one of the first and second diode limit circuits includes a plurality of sets of two diodes connected in parallel in opposite directions which are connected in series.

5. The audio amplifier circuit according to claim 1, wherein the first diode limit circuit includes a plurality of sets of two diodes connected in parallel in opposite directions which are connected in series, the first switch circuit is provided between an intermediate connection point of the plurality of sets of two diodes connected in series and ether the input or the output of the output stage operational amplifier, the second switch circuit is provided between an end of the series connection of the plurality of sets of two diodes and ether the input or the output of the output stage operational amplifier, under the condition when the speaker having a low withstand voltage is connected to the output stage operational amplifier, the first switch circuit is turned ON and the second switch circuit is turned OFF and under the condition when a speaker having a higher withstand voltage than that of the speaker having a low withstand voltage is connected to the output stage operational amplifier, the first switch circuit is turned OFF and the second switch circuit is turned ON.

6. The audio amplifier circuit according to claim 3, wherein ON/OFF of the first and the second switch circuit is selected in accordance with an input signal from outside the audio amplifier circuit and the first and the second diode limit circuit and the output stage operational amplifier are integrated into a single IC.

7. The audio amplifier circuit according to claim 6, wherein the input signal from the outside is a bit signal for setting ON/OFF of the first and the second switch circuit.

8. The audio amplifier circuit according to claim 6, further comprising a level judgment circuit which judges the level of the input signal from the outside, wherein ON/OFF of the first and the second switch circuit is selected in accordance with an output of the level judgment circuit.

9. The audio amplifier circuit according to claim 1, wherein the output stage operational amplifier is constituted by a first and a second output stage amplifier, the second output stage amplifier is an amplifier of inverting operation, the first diode limit circuit is provided for the first output stage amplifier, an output of the first output stage amplifier is input via a resistor to the second output stage amplifier and the speaker is BTL driven by the first and the second output stage amplifier.

10. The audio amplifier circuit according to claim 3, wherein the output stage operational amplifier is constituted by a first and a second output stage amplifier, the second output stage amplifier is an amplifier of inverting operation, the first and the second diode limit circuit are provided for the first output stage amplifier, an output of the first output stage amplifier is input via a resistor to the second output stage amplifier and the speaker is BTL driven by the first and the second output stage amplifier.

11. The audio amplifier circuit according to claim 1, wherein the withstand voltage is related to the maximum input power of the speaker.

12. An audio amplifier circuit comprising a first diode limit switch circuit constituted by a series circuit of first diodes provided bi-directionally and a first switch circuit, and an output stage operational amplifier including a feed back resistor feeding back an output to an input to which the first diode limit switch circuit is connected in parallel, wherein a limit voltage of the first diode limit switch corresponds to a speaker having a low withstand voltage which is connected to an output terminal of the output stage operational amplifier, and wherein the first switch circuit is turned ON under the condition when the speaker is connected to the output stage operational amplifier.

13. An audio IC in which an audio amplifier circuit is integrated, which comprises a first diode limit circuit constituted by a series circuit of first diodes provided bi-directionally and a first switch circuit, and an output stage operational amplifier including a feed back resistor feeding back an output to an input to which the first diode limit circuit is connected in parallel, wherein a limit voltage of the first diode limit circuit corresponds to a speaker having a low withstand voltage which is connected to an output terminal of the output stage operational amplifier, and wherein the first switch circuit is turned ON under the condition when the speaker is connected to the output stage operational amplifier.

14. The audio IC according to claim 13, further comprising a second diode limit circuit constituted by a series circuit of second diodes and a second switch circuit, wherein the first and the second diodes are constituted by two diodes connected in parallel in opposite directions each other, the second diode limit circuit is provided in parallel with the feed back resistor, a limit voltage of the second diode limit circuit is higher than the limit voltage of the first diode limit circuit and corresponds to a speaker having a higher withstand voltage than that of the low withstand voltage speaker, and wherein the first switch circuit is turned OFF and the second switch circuit is turned ON under the condition when the high withstand voltage speaker is connected to the output stage operational amplifier.

15. The audio IC according to claim 14, wherein ON/OFF of the first and the second switch circuit is selected in accordance with an input signal from outside the audio amplifier circuit.

16. The audio IC according to claim 13, wherein the withstand voltage is related to the maximum input power of the speaker.

* * * * *